United States Patent
Choi et al.

(10) Patent No.: US 9,153,355 B2
(45) Date of Patent: Oct. 6, 2015

(54) PASTE COMPOSITION FOR A SOLAR CELL ELECTRODE, ELECTRODE FABRICATED USING THE SAME, AND SOLAR CELL INCLUDING THE ELECTRODE

(75) Inventors: Young Wook Choi, Uiwang-si (KR); Sang Hyun Yang, Uiwang-si (KR); Dae Seop Song, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 530 days.

(21) Appl. No.: 13/603,667

(22) Filed: Sep. 5, 2012

(65) Prior Publication Data
US 2013/0139873 A1    Jun. 6, 2013

(30) Foreign Application Priority Data
Dec. 2, 2011   (KR) .................. 10-2011-0128665

(51) Int. Cl.
| | |
|---|---|
| H01B 1/16 | (2006.01) |
| H01B 1/24 | (2006.01) |
| H01L 31/0224 | (2006.01) |
| C03C 8/18 | (2006.01) |
| H01B 1/22 | (2006.01) |
| C09D 11/52 | (2014.01) |

(52) U.S. Cl.
CPC .. *H01B 1/22* (2013.01); *C03C 8/18* (2013.01); *C09D 11/52* (2013.01); *H01B 1/16* (2013.01); *H01L 31/022425* (2013.01); *Y02E 10/50* (2013.01)

(58) Field of Classification Search
CPC ........ H01B 1/16; H01B 1/22; H01L 31/0224; H01L 23/49883; H01L 35/14; H01L 35/24; C03C 8/18; H05K 1/092; C09D 11/52
See application file for complete search history.

(56) References Cited

U.S. PATENT DOCUMENTS

| 8,419,981 B2 * | 4/2013 | Choi ............................ 252/512 |
| 2012/0119153 A1 * | 5/2012 | Choi ............................ 252/500 |
| 2013/0134363 A1 * | 5/2013 | Song et al. .................... 252/513 |
| 2013/0248777 A1 * | 9/2013 | Sgriccia et al. ............... 252/514 |

FOREIGN PATENT DOCUMENTS

| CN | 101304050 A | 11/2008 |
| JP | 2004-079994 A | 3/2004 |
| JP | 2004-362950 A | 12/2004 |
| KR | 10-2008-0099406 A | 11/2008 |
| KR | 10-2010-0128558 A | 12/2010 |

OTHER PUBLICATIONS

English language machine translation of KR App. 1020090047022 (pub 2010).*
Office Action mailed Dec. 1, 2014 in corresponding Chinese Patent Application No. 201210295696.6.
Office Action in Korean Patent Application No. 10-2011-0128665 mailed Dec. 19, 2013.

* cited by examiner

*Primary Examiner* — Mark Kopec
(74) *Attorney, Agent, or Firm* — Lee & Morse, P.C.

(57) ABSTRACT

A paste composition for a solar cell electrode, a solar cell electrode fabricated using the same, and a solar cell including the electrode, the paste composition including a mixture of conductive powders, the mixture of conductive powders including about 30 wt % to about 55 wt % of a first spherical powder having an average particle diameter D50 of 1.5 μm or less; about 3 wt % to about 8 wt % of a flake powder having an average particle diameter D50 of about 2 μm to about 3.5 μm; and a balance of a second spherical powder having an average particle diameter D50 of greater than 1.5 μm; glass fit; and an organic vehicle.

20 Claims, 1 Drawing Sheet

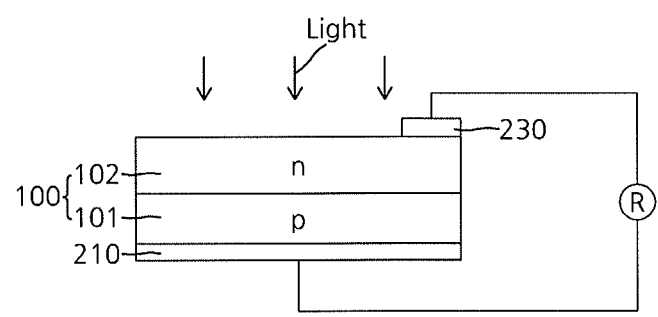

PASTE COMPOSITION FOR A SOLAR CELL ELECTRODE, ELECTRODE FABRICATED USING THE SAME, AND SOLAR CELL INCLUDING THE ELECTRODE

CROSS-REFERENCE TO RELATED APPLICATION

Korean Patent Application No. 10-2011-0128665, filed on Dec. 2, 2011, in the Korean Intellectual Property Office, and entitled: "PASTE COMPOSITION FOR SOLAR CELL ELECTRODE, ELECTRODE FABRICATED USING THE SAME, AND SOLAR CELL INCLUDING THE SAME," is incorporated by reference herein in its entirety.

BACKGROUND

1. Field

Embodiments relate to a paste composition for a solar cell electrode, an electrode fabricated using the same, and a solar cell including the electrode.

2. Description of the Related Art

Solar cells may generate electric energy using the photovoltaic effect of a p-n junction that converts photons of sunlight or other incident light into electricity. In the solar cell, a front electrode and a rear electrode may be formed on front and rear surfaces of a semiconductor wafer or substrate with the p-n junction, respectively. Then, the photovoltaic effect of the p-n junction may be induced by sunlight entering the wafer, and electrons generated by the photovoltaic effect of the p-n junction may provide an electric current flowing through the electrodes. The electrodes of the solar cell may be formed on the wafer by applying, patterning, and firing a paste composition for electrodes.

SUMMARY

Embodiments are directed to a paste composition for a solar cell electrode, an electrode fabricated using the same, and a solar cell including the electrode.

The embodiments may be realized by providing a paste composition for a solar cell electrode, the paste composition including a mixture of conductive powders, the mixture of conductive powders including about 30 wt % to about 55 wt % of a first spherical powder having an average particle diameter D50 of 1.5 μm or less, about 3 wt % to about 8 wt % of a flake powder having an average particle diameter D50 of about 2 μm to about 3.5 μm, and a balance of a second spherical powder having an average particle diameter D50 of greater than 1.5 μm; glass frit; and an organic vehicle.

The first spherical powder may have an average particle diameter D50 of about 0.3 μm to 1.5 μm.

The first spherical powder may have an average particle diameter D90 of about 1 μm to about 2.5 μm.

The first spherical powder may include a mixture of a spherical powder having an average particle diameter D50 of about 0.3 μm to about 1.0 μm and a spherical powder having an average particle diameter D50 of about 1.1 μm to 1.5 μm.

A weight ratio of the spherical powder having the average particle diameter D50 of about 0.3 μm to about 1.0 μm to the spherical powder having the average particle diameter D50 of about 1.1 μm to 1.5 μm may be about 1:0.2 to about 1:2.5.

The second spherical powder may have an average particle diameter D50 of about 1.51 μm to about 3.0 μm.

The second spherical powder may include a mixture of a spherical powder having an average particle diameter D50 of about 1.6 μm to about 2.4 μm and a spherical powder having an average particle diameter D50 of about 2.5 μm to about 3.0 μm.

A weight ratio of the spherical powder having the average particle diameter D50 of about 1.6 μm to about 2.4 μm to the spherical powder having the average particle diameter D50 of about 2.5 μm to about 3.0 μm may be about 2:1 to about 4:1.

The composition may include about 60 wt % to about 90 wt % of the mixture of conductive powders, about 1 wt % to about 10 wt % of the glass fit, and about 7 wt % to about 30 wt % of the organic vehicle.

The embodiments may also be realized by providing a solar cell electrode prepared from the paste composition according to an embodiment.

The first spherical powder may have an average particle diameter D50 of about 0.3 μm to 1.5 μm.

The first spherical powder may have an average particle diameter D90 of about 1 μm to about 2.5 μm.

The first spherical powder may include a mixture of a spherical powder having an average particle diameter D50 of about 0.3 μm to about 1.0 μm and a spherical powder having an average particle diameter D50 of about 1.1 μm to 1.5 μm.

A weight ratio of the spherical powder having the average particle diameter D50 of about 0.3 μm to about 1.0 μm to the spherical powder having the average particle diameter D50 of about 1.1 μm to 1.5 μm may be about 1:0.2 to about 1:2.5.

The second spherical powder may have an average particle diameter D50 of about 1.51 μm to about 3.0 μm.

The second spherical powder may include a mixture of a spherical powder having an average particle diameter D50 of about 1.6 μm to about 2.4 μm and a spherical powder having an average particle diameter D50 of about 2.5 μm to about 3.0

A weight ratio of the spherical powder having the average particle diameter D50 of about 1.6 μm to about 2.4 μm to the spherical powder having the average particle diameter D50 of about 2.5 μm to about 3.0 μm may be about 2:1 to about 4:1.

The embodiments may also be realized by providing a solar cell comprising the electrode according to an embodiment.

The embodiments may also be realized by providing a solar cell including a p-n junction; and an electrode on the p-n junction, the electrode including glass frit, and a mixture of conductive powders, the mixture of conductive powders including about 30 wt % to about 55 wt % of a first spherical powder having an average particle diameter D50 of 1.5 μm or less, about 3 wt % to about 8 wt % of a flake powder having an average particle diameter D50 of about 2 μm to about 3.5 μm, and a balance of a second spherical powder having an average particle diameter D50 of greater than 1.5 μm.

The electrode may have an aspect ratio of about 0.22 or greater.

BRIEF DESCRIPTION OF THE DRAWING

Features will become apparent to those of skill in the art by describing in detail exemplary embodiments with reference to the attached drawing in which:

FIG. 1 illustrates a schematic view of a solar cell manufactured using a paste in accordance with an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey the embodiments to those skilled in the art.

In the drawing FIGURE, the dimensions of layers and regions may be exaggerated for clarity of illustration. It will also be understood that when a layer or element is referred to as being "on" another layer or substrate, it can be directly on the other layer or substrate, or intervening layers may also be present.

An embodiment provides a paste composition for a solar cell electrode. The composition may include, e.g., a mixture of conductive powders; glass frit; and an organic vehicle.

In an implementation, the paste composition may include about 60 wt % to about 90 wt % of the mixture of conductive powders, about 1 wt % to about 10 wt % of the glass frit, and about 7 wt % to about 30 wt % of the organic vehicle.

Mixture of Conductive Powders

Examples of the conductive powder (for the mixture of conductive powders) may include silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), and magnesium (Mg) powder. The conductive powder may be used alone or as a mixture or alloy of two or more kinds thereof. In an implementation, the conductive powder may include silver powder or a mixture including silver powder. In an implementation, the conductive powder may further include nickel (Ni), cobalt (Co), iron (Fe), zinc (Zn) and/or copper (Cu) powder, in addition to the silver powder.

As described above, the mixture of conductive powders may be present in the paste composition in an amount of about 60 wt % to about 90 wt %. Within this range, deterioration in conversion efficiency of a solar cell due to resistance increase and difficulty in forming the paste due to a relative reduction in amount of the organic vehicle may be reduced and/or prevented. In an implementation, the mixture of conductive powders may be present in an amount of about 70 wt % to about 88 wt %.

The mixture of conductive powders may include a mixture of a spherical powder and a flake powder. In an implementation, the mixture of conductive powders may include about 30 wt % to about 55 wt % of a first spherical powder (A) having an average particle diameter (D50) of 1.5 μm or less, about 3 wt % to about 8 wt % of a flake powder (B) having an average particle diameter (D50) of about 2 μm to about 3.5 μm, and a balance of a second spherical powder (C) having an average particle diameter (D50) of greater than 1.5 μm.

Herein, the "average particle diameters (D50), (D90), (D10)" of the conductive powder and the glass fit may be measured using, for example, a Model 1064D (CILAS Co., Ltd.) after dispersing the conductive powder or the glass frit in isopropyl alcohol (IPA) at 25° C. for 3 minutes via ultrasonication.

First Spherical Powder (A)

The first spherical powder (A) may have an average particle diameter (D50) of 1.5 μm or less. Within this range, the paste composition may have high storage modulus and a low tan δ (storage modulus/loss modulus), thereby facilitating an increase in the aspect ratio of the electrode. In an implementation, the average particle diameter of the first spherical power (A) may be about 0.3 μm to 1.5 μm, e.g., about 0.8 μm to 1.5 μm.

In an implementation, the first spherical powder (A) may have an average particle diameter (D90) of about 1 μm to about 2.5 μm, e.g., about 1.3 μm to about 2.2 μm. In an implementation, the first spherical powder (A) may have an average particle diameter (D10) of about 0.1 μm to 1.1 μm, e.g., about 0.4 μm to about 1.0 μm.

The first spherical powder (A) may be present in the mixture of conductive powders in an amount of about 30 wt % to about 55 wt %. Within this range, the paste composition may have high storage modulus and a low tan δ (storage modulus/ loss modulus), thereby facilitating an increase in the aspect ratio of the electrode. In an implementation, the first spherical powder (A) may be present in an amount of about 40 wt % to about 52 wt %.

The first spherical powder (A) may include a mixture of spherical powders having different average particle diameters. In an implementation, the first spherical powder (A) may include a mixture of a spherical powder (a1) having an average particle diameter (D50) of about 0.3 μm to 1.0 μm and a spherical powder (a2) having an average particle diameter (D50) of greater than 1.0 μm to 1.5 μm, e.g., about 1.1 μm to 1.5 μm.

The spherical powder (a1) may have an average particle diameter (D90) of about 1.0 μm to about 1.5 μm, and an average particle diameter (D10) of about 0.1 μm to about 0.8 μm. The spherical powder (a2) may have an average particle diameter (D90) of about 1.6 μm to about 2.5 μm, and an average particle diameter (D10) of about 0.81 μm to about 1.1 μm. Within these ranges of the average particle diameters (D50, D90, D10), the paste composition may have high storage modulus and a low tan δ (storage modulus/loss modulus), thereby facilitating an increase in the aspect ratio of the electrode.

A weight ratio ((a1):(a2)) of the spherical powder (a1) to the spherical powder (a2) may be about 1:0.2 to about 1:2.5, e.g., about 1:0.4 to about 1:2.2 or about 1:0.4 to 1:2.1.

Each of the spherical powder (a1) and the spherical powder (a2) may be present in the mixture of conductive powders in an amount of about 10 wt % to about 40 wt %. Within this range, the paste composition may have high storage modulus and a low tan δ (storage modulus/loss modulus), thereby facilitating an increase in the aspect ratio of the electrode. In an implementation, each of the spherical powder (a1) and the spherical powder (a2) may be present in an amount of about 15 wt % to about 35 wt %.

Flake Powder (B)

The flake powder (B) may have an average particle diameter (D50) of about 2 μm to about 3.5 μm. For the flake powder, the term 'average particle diameter' refers to a value with respect to the diameter of the flake powder, rather than the thickness of the flake powder. Within this range, the paste composition may have high storage modulus and a low tan δ (storage modulus/loss modulus), thereby facilitating an increase in the aspect ratio of the electrode. In an implementation, the flake powder may have an average particle diameter of about 2 μm to about 3 μm.

In an implementation, the flake powder (B) may have an average particle diameter (D90) of about 5.5 μm to about 7 μm, e.g., about 6 μm to about 7 μm. In an implementation, the flake powder (B) may have an average particle diameter (D10) of about 0.2 μm to about 1.2 μm, e.g., about 0.4 μm to about 1.0 μm.

The flake powder (B) may be present in the mixture of conductive powders in an amount of about 3 wt % to about 8 wt %. Within this range, the paste composition may have high storage modulus and a low tan δ, thereby facilitating an increase in the aspect ratio of the electrode. In an implementation, the flake powder (B) may be present in an amount of about 4 wt % to about 6 wt %.

In the paste composition, a weight ratio ((A)/(B)) of the first spherical powder (A) to the flake powder (B) may be about 4.5 to about 9.5, e.g., about 6.5 to about 8.7.

Second Spherical Powder (C)

The second spherical powder (C) may have an average particle diameter (D50) of greater than 1.5 μm. Within this range, the paste composition may have high storage modulus and a low tan δ, thereby facilitating an increase in the aspect ratio of the electrode. In an implementation, the average particle diameter (D50) of the second spherical powder (C) may be greater than 1.5 μm to about 3.0 μm, e.g., about 1.51 μm to about 3.0 μm or about 1.8 μm to about 2.8 μm.

In an implementation, the second spherical powder (C) may have an average particle diameter (D90) of about 2.55 μm to about 5 μm, e.g., about 2.8 μm to about 4.3 μm. Within this range, it is possible to suppress a viscosity increase due to the use of large amounts of powders having a small average particle diameter.

In an implementation, the second spherical powder (C) may have an average particle diameter (D10) of about 1.15 μm to about 2.0 μm, e.g., about 1.2 μm to about 1.6 μm.

The second spherical powder (C) may be present in the balance or remaining amount in the mixture of conductive powders, except for the first spherical powder (A) and the flake powder (B). For example, the second spherical powder (C) may be present in an amount of about 42 wt % to about 67 wt % or about 42 wt % to about 61 wt %.

The second spherical powder (C) may include a mixture of spherical powders having different average particle diameters. In an implementation, the second spherical powder (C) may include a mixture of a spherical powder (c1) having an average particle diameter (D50) of greater than 1.5 μm to 2.4 μm, e.g., about 1.6 μm to 2.4 μm, and a spherical powder (c2) having an average particle diameter (D50) of greater than 2.4 μm to about 3.0 μm, e.g., about 2.5 μm to about 3.0 μm.

In an implementation, the spherical powder (c1) may have an average particle diameter (D50) of about 1.6 μm to about 2.4 μm, e.g., about 1.6 μm to about 1.9 μm, an average particle diameter (D90) of about 2.6 μm to about 3.0 μm, and an average particle diameter (D10) of about 1.15 μm to about 1.5 μm. In an implementation, the spherical powder (c2) may have an average particle diameter (D50) of about 2.5 μm to about 3.0 μm, an average particle diameter (D90) of about 3.01 μm to about 4.3 μm, and an average particle diameter (D10) of about 1.51 μm to about 1.6 μm.

A weight ratio ((c1):(c2)) of the spherical powder (c1) to the spherical powder (c2) may be about 2:1 to about 4:1, e.g., about 2.5:1 to about 3.5:1.

In an implementation, the spherical powder (c1) may be present in the mixture of conductive powders in an amount of about 20 wt % to about 50 wt %, and the spherical powder (c2) may be present in the mixture of conductive powders in an amount of about 10 wt % to about 20 wt %.

In the paste composition, a weight ratio ((C)/(B)) of the second spherical powder (C) to the flake powder (B) may be about 7 to about 11, e.g., about 7 to about 9.

Glass Frit

The glass frit may help to enhance adhesion of the conductive powder with respect to the wafer or the substrate and may help to generate crystals of the conductive powder in an emitter region by etching an anti-reflection layer and melting the conductive powder so as to reduce contact resistance during a firing process of the paste.

The glass frit may include a crystallized glass frit or non-crystallized glass frit. The glass frit may include, e.g., a leaded glass frit, a lead-free glass frit, and/or a mixture thereof.

For example, the glass frit may include at least one kind selected from the group of PbO, ZnO, $SiO_2$, $Al_2O_3$, $Ta_2O_5$, $P_2O_5$, $ZrO_2$, $Bi_2O_3$, $B_2O_3$, $Fe_2O_3$, $Cr_2O_3$, $Co_2O_3$, and $MnO_2$. A composition of respective components contained in the glass frit may be adjusted in consideration of efficiency of the electrode.

For example, the glass frit may include at least one kind selected from zinc oxide-silicon oxide ($ZnO-SiO_2$), zinc oxide-boron oxide-silicon oxide ($ZnO-B_2O_3-SiO_2$), zinc oxide-boron oxide-silicon oxide-aluminum oxide ($ZnO-B_2O_3-SiO_2-Al_2O_3$), bismuth oxide-silicon oxide ($Bi_2O_3-SiO_2$), bismuth oxide-boron oxide-silicon oxide ($Bi_2O_3-B_2O_3-SiO_2$), bismuth oxide-boron oxide-silicon oxide-aluminum oxide ($Bi_2O_3-B_2O_3-SiO_2-Al_2O_3$), bismuth oxide-zinc oxide-boron oxide-silicon oxide ($Bi_2O_3-ZnO-B_2O_3-SiO_2$), and bismuth oxide-zinc oxide-boron oxide-silicon oxide-aluminum oxide ($Bi_2O_3-ZnO-B_2O_3-SiO_2-Al_2O_3$) glass frit.

The glass fit may have a softening point of about 300° C. to about 600° C., e.g., about 400° C. to about 550° C.

The glass frit may have an average particle diameter (D50) of about 0.1 μm to about 5 μm, e.g., about 0.5 μm to about 3 μm.

The glass frit may be present in the paste composition in an amount of about 1 wt % to about 10 wt %. Within this range, sintering properties and adhesion of the conductive powder may be improved, and a deterioration in conversion efficiency due to resistance increase may be reduced and/or prevented. Further, it is possible to reduce and/or prevent an excessive amount of glass frit from remaining after firing, which may cause an increase in resistance and deterioration in wettability. In an implementation, the glass fit may be present in an amount of about 1 wt % to about 7 wt %.

Organic Vehicle

The organic vehicle may include an organic binder that provides liquid properties to the paste.

Examples of the organic binder may include cellulose polymers, such as ethyl cellulose, hydroxyethyl cellulose, hydroxypropyl cellulose, hydroxyethyl hydroxypropyl cellulose, and the like; acrylic polymers obtained by copolymerization with hydrophilic acrylic monomers such as carboxyl groups; and polyvinyl resins. The organic binders may be used alone or as a mixture of two or more thereof.

The organic vehicle may further include a solvent. In an implementation, the organic vehicle may be a solution prepared by dissolving the organic binder in the solvent. The organic vehicle may include about 5 wt % to about 40 wt % of the organic binder and about 60 wt % to about 95 wt % of the solvent. In an implementation, the organic vehicle may include about 6 wt % to about 30 wt % of the organic binder and about 70 wt % to about 94 wt % of the solvent.

The solvent may include an organic solvent having a boiling point of about 120° C. or higher. For example, the solvent may be selected from the group of carbitol solvents, aliphatic alcohols, ester solvents, cellosolve solvents and hydrocarbon solvents, which may be typically used in the production of electrodes. Examples of solvents suitable for use in the conductive paste composition may include butyl carbitol, butyl carbitol acetate, methyl cellosolve, ethyl cellosolve, butyl cellosolve, aliphatic alcohols, terpineol, ethylene glycol, ethylene glycol monobutyl ether, butyl cellosolve acetate, texanol, and mixtures thereof.

The organic vehicle may be present in the paste composition in an amount of about 7 wt % to about 30 wt %. Within this range, inefficient dispersion or an excessive increase in viscosity after preparation of the paste may be reduced and/or prevented, thereby facilitating printing. In addition, an increase in resistance and other problems that can occur during the firing process may be reduced and/or prevented. In an implementation, the organic vehicle may be present in an amount of about 10 wt % to about 25 wt %.

In an implementation, the paste composition may further include an additive, as desired, to help enhance flow properties, process properties, and stability. The additive may include, e.g., a dispersant, a thixotropic agent, a plasticizer, a viscosity stabilizer, an anti-foaming agent, a pigment, a UV stabilizer, an antioxidant, a coupling agent, or mixtures thereof. In an implementation, the additive may be present in the paste composition in an amount of about 0.1 wt % to about 5 wt %.

In an implementation, the paste composition may have a storage modulus of about 10,000 Pa or more and a tan δ of about 0.4 or less. Within these ranges, the paste composition may form an electrode having an improved, e.g., larger, aspect ratio, thereby improving conversion efficiency while reducing resistance. In an implementation, the paste composition may have a storage modulus of about 10,000 to about 30,000 Pa, and a tan δ of about 0.2 to about 0.35.

Loss modulus to obtain the storage modulus and tan δ may be measured by a suitable method. For example, the storage modulus and loss modulus of the paste may be measured using an ARES G2 (TA Instrument Inc.) under conditions of 5 mm cone, 5 mm plate, 0.2% strain, 25° C. and 2 Hz.

Another embodiment provides an electrode formed using the paste composition, and a solar cell including the same. FIG. 1 illustrates a solar cell in accordance with an embodiment.

Referring to FIG. 1, a rear electrode 210 and a front electrode 230 may be formed by printing and firing the paste composition on a wafer or substrate 100 that includes a p-layer 101 and an n-layer 102, which will serve as an emitter. For example, a preliminary process for preparing the rear electrode 210 may be performed by printing the paste composition on a rear surface of the wafer 100 and drying the printed paste composition at about 200~400° C. for about 10~60 seconds. Further, a preliminary process for preparing the front electrode may be performed by printing the paste composition on a front surface of the wafer and drying the printed paste composition. Then, the front electrode 230 and the rear electrode 210 may be formed by firing the wafer at about 400 to about 950° C., e.g., at about 850° C. to about 950° C., for about 30 to 50 seconds.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

EXAMPLES

Specifications of components used in the following Examples and Comparative Examples were as follows:

(1) Conductive powder: Spherical silver powders (a1), (a2), (c1), and (c2), and flake silver powder (B) having properties given in Table 1 were used.

TABLE 1

| | | D50 (μm) | D90 (μm) | D10 (μm) | Tap density (g/cm$^3$) | Specific surface area (m$^2$/g) | Grade | Manufacturer |
|---|---|---|---|---|---|---|---|---|
| First spherical powder (A) | Spherical powder (a1) | 0.8 | 1.3 | 0.4 | 4.3 | 1.1 | 2-1C | DOWA |
| | Spherical powder (a2) | 1.4 | 2.2 | 1.0 | 5.0 | 0.7 | 3-11F | DOWA |
| Flake powder (B) | | 2.7 | 6.2 | 1.0 | 3.3 | 1.3 | HP0202E | Heesung Metal |
| Second spherical powder (C) | Spherical powder (c1) | 1.8 | 2.8 | 1.2 | 4.8 | 0.6 | 4-11F | DOWA |
| | Spherical powder (c2) | 2.8 | 4.3 | 1.6 | 4.8 | 0.4 | 5-11F | DOWA |

(2) Glass frit: Leaded glass frit having an average particle diameter (D50) of 0.9 μm and a softening point of 414° C. (Leaded Glass, CI-109, Particlogy Co., Ltd.) was used (3) Organic vehicle: Ethyl cellulose (Dow Chemical Co., Ltd., STD4) and butyl carbitol were used.

Examples 1 to 5

With the composition prepared at a ratio given in Table 2 (unit:wt %), below, 85 parts by weight of the conductive powder, 5 parts by weight of the glass fit, and 10 parts by weight of the organic vehicle (prepared by dissolving 1 part by weight of ethyl cellulose in 9 parts by weight of butyl carbitol at 60° C.) were mixed, followed by kneading using a 3-roll kneader, thereby preparing paste compositions for solar cell electrodes.

Comparative Examples 1 to 6

The same process as in Examples 1 to 5 was carried out to prepare paste compositions for solar cell electrodes except that the conductive powder had compositions as shown in Table 3 (unit: wt %).

TABLE 2

| | | Example 1 | Example 2 | Example 3 | Example 4 | Example 5 |
|---|---|---|---|---|---|---|
| First spherical powder (A) | Spherical powder (a1) | 40 | 40 | — | 17 | 35 |
| | Spherical powder (a2) | — | — | 40 | 35 | 17 |

TABLE 2-continued

|  |  | Example 1 | Example 2 | Example 3 | Example 4 | Example 5 |
|---|---|---|---|---|---|---|
| Flake powder (B) |  | 6 | 6 | 6 | 6 | 6 |
| Second spherical powder (C) | Spherical powder (c1) | 54 | 42 | 42 | 30 | 30 |
|  | Spherical powder (c2) | — | 12 | 12 | 12 | 12 |

TABLE 3

|  |  | Comparative Example 1 | Comparative Example 2 | Comparative Example 3 | Comparative Example 4 | Comparative Example 5 | Comparative Example 6 |
|---|---|---|---|---|---|---|---|
| First spherical powder (A) | Spherical powder (a1) | 25 | 18 | 55 | 40 | 40 | 17 |
|  | Spherical powder (a2) | — | — | — | — | — | 17 |
| Flake powder (B) |  | 6 | 6 | 6 | 2 | 9 | 30 |
| Second spherical powder (C) | Spherical powder (c1) | 69 | 65 | 39 | 58 | 51 | 24 |
|  | Spherical powder (c2) | — | 11 | — | — | — | 12 |

Experiment: Evaluation of Paste Composition and Electrode

The paste compositions prepared in the Examples and Comparative Examples and electrodes prepared using the paste compositions were subjected to property evaluation, and results are shown in Tables 4 and 5, below.

Evaluation of Properties (1) Modulus: Storage modulus and loss modulus of the paste were measured using an ARES G2 (TA Instrument Inc.) under conditions of 5 mm cone, 5 mm plate, 0.2% strain, 25° C. and 2 Hz, and tan δ values were calculated therefrom.

(2) Aspect ratio of electrode: The paste was printed on a front side of a wafer in a predetermined pattern by screen printing, followed by drying in an IR oven. Then, an aluminum paste was printed over a front side of the wafer, followed by drying in the same way. The prepared cell was subjected to firing in a belt type furnace at 250 ipm, 6 zone, 950° C. For the cell, the thickness and line width of the fired front pattern were measured using a 3D laser microscope (VK-9700K, KEYENCE Co., Ltd.) to obtain an aspect ratio (thickness/line width).

TABLE 4

|  | Example 1 | Example 2 | Example 3 | Example 4 | Example 5 |
|---|---|---|---|---|---|
| Storage Modulus (Pa) | 15,126 | 14,026 | 19,876 | 25,731 | 12,195 |
| tan δ | 0.28 | 0.29 | 0.32 | 0.32 | 0.30 |
| Aspect ratio | 0.25 | 0.22 | 0.27 | 0.30 | 0.30 |

TABLE 5

|  | Comparative Example 1 | Comparative Example 2 | Comparative Example 3 | Comparative Example 4 | Comparative Example 5 | Comparative Example 6 |
|---|---|---|---|---|---|---|
| Storage Modulus (Pa) | 7,168 | 6,068 | 9,980 | 8,700 | 8,452 | 6,095 |
| tan δ | 0.35 | 0.26 | 0.65 | 0.47 | 0.36 | 0.27 |
| aspect ratio | 0.17 | 0.15 | 0.10 | 0.18 | 0.14 | 0.18 |

As may be seen in Tables 4 and 5, the electrodes fabricated using the paste compositions according to an embodiment had high aspect ratios, thereby providing high efficiency.

By way of summation and review, high efficiency of a solar cell may be obtained by reducing linear resistance to achieve efficient flow of electric current while increasing a quantity of incident light as much as possible and providing a wide light receiving surface. Accordingly, increasing an aspect ratio of a solar cell electrode (electrode thickness/electrode line width) by narrowing the line width of the electrode while increasing the thickness of the electrode may be desirable. Increasing the aspect ratio of the electrode by restricting an amount of plasticizer in a paste composition, using a binder having a high glass transition temperature for a double layer electrode, or the like has been considered.

The embodiments provide a paste composition for solar cell electrodes, which includes a mixture of conductive powders including a particular amount of conductive powder having a particular average particle diameter and a particular shape, electrodes fabricated using the same, and solar cells including the same. The embodiments provide electrodes that realize a narrow line width and a high thickness, e.g., a high aspect ratio (electrode thickness/electrode line width), in fabrication of electrodes by screen printing, thereby providing high efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A paste composition for a solar cell electrode, the paste composition comprising:
   a mixture of conductive powders, the mixture of conductive powders including:
      about 30 wt % to about 55 wt % of a first spherical powder having an average particle diameter D50 of 1.5 μm or less,
      about 3 wt % to about 8 wt % of a flake powder having an average particle diameter D50 of about 2 μm to about 3.5 μm, and
      a balance of a second spherical powder having an average particle diameter D50 of greater than 1.5 μm;
   glass frit; and
   an organic vehicle.

2. The paste composition as claimed in claim 1, wherein the first spherical powder has an average particle diameter D50 of about 0.3 μm to 1.5 μm.

3. The paste composition as claimed in claim 1, wherein the first spherical powder has an average particle diameter D90 of about 1 μm to about 2.5 μm.

4. The paste composition as claimed in claim 1, wherein the first spherical powder includes a mixture of a spherical powder having an average particle diameter D50 of about 0.3 μm to about 1.0 μm and a spherical powder having an average particle diameter D50 of about 1.1 μm to 1.5 μm.

5. The paste composition as claimed in claim 4, wherein a weight ratio of the spherical powder having the average particle diameter D50 of about 0.3 μm to about 1.0 μm to the spherical powder having the average particle diameter D50 of about 1.1 μm to 1.5 μm is about 1:0.2 to about 1:2.5.

6. The paste composition according as claimed in claim 1, wherein the second spherical powder has an average particle diameter D50 of about 1.51 μm to about 3.0 μm.

7. The paste composition as claimed in claim 1, wherein the second spherical powder includes a mixture of a spherical powder having an average particle diameter D50 of about 1.6 μm to about 2.4 μm and a spherical powder having an average particle diameter D50 of about 2.5 μm to about 3.0 μm.

8. The paste composition as claimed in claim 7, wherein a weight ratio of the spherical powder having the average particle diameter D50 of about 1.6 μm to about 2.4 μm to the spherical powder having the average particle diameter D50 of about 2.5 μm to about 3.0 μm is about 2:1 to about 4:1.

9. The paste composition as claimed in claim 1, wherein the composition includes:
   about 60 wt % to about 90 wt % of the mixture of conductive powders,
   about 1 wt % to about 10 wt % of the glass fit, and
   about 7 wt % to about 30 wt % of the organic vehicle.

10. A solar cell electrode prepared from the paste composition as claimed in claim 1.

11. The solar cell electrode as claimed in claim 10, wherein the first spherical powder has an average particle diameter D50 of about 0.3 μm to 1.5 μm.

12. The solar cell electrode as claimed in claim 10, wherein the first spherical powder has an average particle diameter D90 of about 1 μm to about 2.5 μm.

13. The solar cell electrode as claimed in claim 10, wherein the first spherical powder includes a mixture of a spherical powder having an average particle diameter D50 of about 0.3 μm to about 1.0 μm and a spherical powder having an average particle diameter D50 of about 1.1 μm to 1.5 μm.

14. The solar cell electrode as claimed in claim 13, wherein a weight ratio of the spherical powder having the average particle diameter D50 of about 0.3 μm to about 1.0 μm to the spherical powder having the average particle diameter D50 of about 1.1 μm to 1.5 μm is about 1:0.2 to about 1:2.5.

15. The solar cell electrode as claimed in claim 10, wherein the second spherical powder has an average particle diameter D50 of about 1.51 μm to about 3.0 μm.

16. The solar cell electrode as claimed in claim 10, wherein the second spherical powder includes a mixture of a spherical powder having an average particle diameter D50 of about 1.6 μm to about 2.4 μm and a spherical powder having an average particle diameter D50 of about 2.5 μm to about 3.0 μm.

17. The solar cell electrode as claimed in claim 16, wherein a weight ratio of the spherical powder having the average particle diameter D50 of about 1.6 μm to about 2.4 μm to the spherical powder having the average particle diameter D50 of about 2.5 μm to about 3.0 μm is about 2:1 to about 4:1.

18. A solar cell comprising the electrode as claimed in claim 10.

19. A solar cell, comprising:
   a p-n junction; and
   an electrode on the p-n junction, the electrode including:
   glass frit, and
   a mixture of conductive powders, the mixture of conductive powders including:
      about 30 wt % to about 55 wt % of a first spherical powder having an average particle diameter D50 of 1.5 μm or less,
      about 3 wt % to about 8 wt % of a flake powder having an average particle diameter D50 of about 2 μm to about 3.5 μm, and
      a balance of a second spherical powder having an average particle diameter D50 of greater than 1.5 μm.

20. The solar cell as claimed in claim 19, wherein the electrode has an aspect ratio of about 0.22 or greater.

* * * * *